United States Patent [19]
Bathey

[11] Patent Number: 5,913,980
[45] Date of Patent: *Jun. 22, 1999

[54] METHOD FOR REMOVING COMPLEX OXIDE FILM GROWTH ON SILICON CRYSTAL

[75] Inventor: Balakrishnan R. Bathey, Upper St. Clair, Pa.

[73] Assignee: Ebara Solar, Inc., Large, Pa.

[*] Notice: This patent issued on a continued prosecution application filed under 37 CFR 1.53(d), and is subject to the twenty year patent term provisions of 35 U.S.C. 154(a)(2).

[21] Appl. No.: 08/831,606

[22] Filed: Apr. 10, 1997

Related U.S. Application Data

[60] Provisional application No. 60/015,148, Apr. 10, 1996.

[51] Int. Cl.[6] .................... B08B 3/08; C23G 1/02; C23G 1/14
[52] U.S. Cl. .................... 134/2; 134/3; 134/28; 134/29; 216/99; 438/753; 438/756
[58] Field of Search .............. 134/2, 3, 28, 29; 219/99; 438/753, 756

[56] References Cited

U.S. PATENT DOCUMENTS

| | | | |
|---|---|---|---|
| 3,194,703 | 7/1965 | Bloem | 438/753 |
| 3,266,961 | 8/1966 | Emeis | 438/753 |
| 3,486,953 | 12/1969 | Ing et al. | 438/753 |
| 4,389,377 | 6/1983 | Duncan et al. | 422/246 |
| 5,300,463 | 4/1994 | Cathey et al. | 438/756 |
| 5,489,557 | 2/1996 | Jolley | 438/756 |
| 5,509,970 | 4/1996 | Siramizu | 134/3 |
| 5,679,171 | 10/1997 | Saga et al. | 134/26 |
| 5,681,397 | 10/1997 | Li | 134/3 |

*Primary Examiner*—Jill Warden
*Assistant Examiner*—Saeed Chaudhry
*Attorney, Agent, or Firm*—Graham & James LLP

[57] ABSTRACT

A method for treating thin silicon web crystals used to produce solar cells in order to remove complex SiOx contaminants from the web after growth. A dendritic silicon web with {111} surface orientation is immersed in a caustic solution of KOH or NaOH at a temperature at a range from about 80 to about 85° C. for a period of about five to about ten minutes. The caustic solution quickly removes the SiOx contaminants, while leaving relatively unaffected the silicon crystal in the surface. After the caustic solution treatment, the web is rinsed in deionized water and optionally subjected to an acid cleaning with HCL or HF in order to remove any residual contaminants on the web surface.

20 Claims, No Drawings

METHOD FOR REMOVING COMPLEX OXIDE FILM GROWTH ON SILICON CRYSTAL

CROSS-REFERENCE TO PROVISIONAL APPLICATION

Applicant hereby claims the benefit under 35 U.S.C. Section 119(e) of United States Provisional application Serial No. 60/015,148 filed Apr. 10, 1996.

BACKGROUND OF THE INVENTION

This invention relates to fabrication of solar cells in general and, more particularly, to the production of dendritic silicon crystal webs from which individual solar cells are obtained.

Silicon crystals are typically grown in a growth furnace using a fused silica crucible to contain a silicon melt. Silicon dissolves in the crucible at a melt temperature of about 1412° C. As a result, silicon monoxide (SiO) gas is evolved from the melt and condenses at the colder regions of the growth furnace and on the growing silicon crystals. In the case of Czochralski (CZ), cast, and some other crystal growth methods used to produce silicon wafers, the resulting wafers are chemically cleaned to remove the surface materials to a depth as great as 50–70 microns. In these cases, the SiO deposited on the grown silicon does not pose a problem. In other cases, such as the Dendritic Web growth process, the thickness of the silicon ribbon grown is very small, on the order of about 100 microns. Therefore, extensive removal of silicon cannot be tolerated for thin crystals.

The Dendritic Web silicon growth technique is well known and is described in the literature. In general, a thin ribbon, typically about 100 microns thick, is grown from silicon melt contained in a fused silica crucible. Silicon monoxide evolved from the crucible deposits on the growing ribbon and inside the furnace chamber. The oxide thickness ranges from about 100 to about 1000 Å. Fourier Transform Infrared Analysis has shown that the oxide is composed of complex $SiO_x$, where x ranges from 1 to 2. This oxide film must be removed for further processing of the crystal into solar cells. While some portions of the oxide can be removed by chemical cleaning with an acid solution, such as hydrofluoric acid (HF), such simple immersion does not completely remove the oxide.

In the past, it has been considered necessary to use mechanical cleaning methods to completely remove the oxide after hydrofluoric acid cleaning. This method is still not satisfactory since submicron SiO particles embedded in the silicon crystals cannot be completely removed. Although a strong acid mixture consisting of hydrofluoric and nitric acid can remove the oxide, this process consumes a significant amount of silicon and leaves a pitted surface, which is undesirable for thin crystals. In addition, this process is expensive for solar cell applications due to the cost involved in disposing of the hazardous chemicals.

In the field of silicon wafer technology, Czochralski, Float Zone, and Cast silicon wafers are typically sliced to the desired thickness using a diamond saw. This slicing operation damages the silicon surface to a depth of about 50 to 70 microns. This saw damage is typically removed using an acid mixture containing hydrofluoric acid (HF) and nitric acid ($HNO_3$). To obtain a smooth surface and reduce the etching rate, acetic acid ($CH_3COOH$) is usually added to this mixture. This acid mixture, known as an isotropic etchant, removes silicon uniformly independent of the orientation of the crystal.

Caustic solutions, such as potassium hydroxide (KOH) or sodium hydroxide (NaOH), have also been used to remove silicon surfaces by chemical etching. However, the etch rate is dependent upon the temperature and concentration of the solutions as well as on the crystallographic orientation of the silicon. For example, the etch rate of crystal with {111} orientation is about 5 to 10 times slower than the etch rate of crystal with {100} orientation. In addition, the etch rate for {111} orientation significantly decreases as a function of time or the amount of material removed. It has been reported that within 1.5 mils total removal, the average rate drops to <$\frac{1}{50}$ the starting rate and the later rate to <$\frac{1}{200}$.

SUMMARY OF THE INVENTION

The invention comprises an economical and effective method for removing the complex silicon oxide grown on thin web crystals but without any substantial dissolving of silicon.

The method proceeds by providing a thin web crystal, preferably with a {111} surface orientation, and applying a caustic solution at a temperature within a preferred range to a surface of the web crystal for a first period of time sufficient for the caustic solution to remove a substantial portion of SiOx impurities present in the web crystal. The step of providing a thin web crystal preferably includes the step of growing a thin web using a dendritic web silicon growth process.

The step of applying a caustic solution is preferably performed by immersing the web crystal in a volume of the caustic solution (e.g. contained in a tank or other vessel). The preferred temperature range is from about 80° C. to about 85° C.; while the first period of time is preferably in the range from about five to about ten minutes.

After removal of the SiOx impurities, the silicon web crystal is preferably rinsed in a water rinse, preferably using deionized water, for a period of time (typically seven to ten minutes); and thereafter optionally treated by applying an acid solution to the web for a second period of time sufficient to remove any surface contaminants, such as residual potassium from the application of the caustic solution. The acid solution is preferably either hydrofluoric acid or hydrochloric acid, each in a concentration of about ten percent by weight, and the acid solution is typically applied for a period from about one to about two minutes.

The invention enables the removal of the SiOx impurities from thin silicon web crystals without damaging the crystals by removing substantial amounts of the silicon itself. In addition, since the caustic etching process produces hydrogen gas, which is non-poisonous and lighter than air, it is only necessary to vent the gaseous byproduct from the production facility and costly scrubbing or other exhaust gas treatment equipment is unnecessary. The process is therefore highly economical and relatively safe.

For a fuller understanding of the nature and advantages of the invention, reference should be had to the ensuing detailed description.

DETAILED DESCRIPTION OF THE PREFERRED EMBODIMENTS

Web crystal is first grown with a {111} surface orientation preferably using the dendritic web silicon growth technique. This technique is described in U.S. Pat. No. 4,389,377, and in the technical article by R. G. Seidensticker, J. Crystal Growth, 39, 1977, the disclosures of which are hereby incorporated by reference. After a relatively long continuous dendritic web has been prepared, it is cut into sections of about 33 cm in length, and these web sections are then placed in a suitable carrier for fluid processing.

Initially, the carrier with the silicon web crystal sections is immersed in a tank containing a caustic solution of potassium hydroxide (KOH) or sodium hydroxide (NaOH) for a preferred time period in the range from about five to about ten minutes at a temperature in the preferred range of about 80 to about 85° C. While immersed in the caustic solution, the SiOx is removed at a relatively fast rate: however, the silicon itself is etched by the caustic solution at a substantially slower rate. Thus, while it is known that caustic solutions such as potassium hydroxide and sodium hydroxide can be used to remove silicon surfaces, the etch rate of crystal with {111} orientation is substantially slower than the removal rate of SiOx by the same caustic solution. Since web silicon is usually on the order of about 100 microns in thickness, it is important that the SiOx removal process not remove substantial amounts of silicon. This is effectively accomplished according to the invention by using the {111} orientation crystal web in conjunction with the caustic solution at the preferred temperature range. Both potassium hydroxide and sodium hydroxide solutions are relatively ineffective in etching {111} surface orientation silicon crystals, yet these solutions dissolve SiOx of all compositions grown on the web surface. The grown-in silicon oxide is completely removed within five to ten minutes in this process. Caustic solutions in a concentration range of from about ten percent to about 49 percent by volume may be used. In general, the stronger the concentration, the faster the SiOx removal occurs. In addition, a smoother and more desirable surface finish is obtained with stronger concentrations.

After treatment with the caustic solution, the carrier is removed to a rinse tank, typically containing deionized water, and is rinsed for a preferred period of from about seven to about ten minutes. After the deionized water rinse, the individual web lengths in the carrier may be subjected to an optional acid wash, preferably using hydrofluoric or hydrochloric acid in a ten percent by volume solution for a period from about one to about two minutes. This step is used to remove any residual potassium or any other contaminants which might be left on the crystal web surface.

Web crystals treated in accordance with the invention using potassium hydroxide at 85° C. for seven minutes, and a post-cleaning acid wash, were analyzed. The oxide film was found to have been completely removed. Solar cells made from silicon web crystals treated according to the invention exhibited cell efficiencies in excess of 13 percent, which is currently considered to be relatively high.

The method described above using caustic solution to remove SiOx is both cost effective and less hazardous than any other known methods. This is due to several reasons. Both KOH and NaOH are capable of being economically and easily disposed of by neutralizing these chemicals. This neutralization process can also potentially eliminate expensive pre-diffusion cleaning with commercially available solutions, such as the RCA I and RCA II solutions available today which contain hydrochloric and ammonium peroxide acid mixtures.

The chemical reaction for caustic KOH is:

$$Si + 2KOH + H_2O = K_2SiO_3 + 2H_2$$

The chemical reaction for an acid etching process is:

$$Si + 4HNO_3 + 6HF = H_2SiF_6 + 4NO_2 + 4H_2O$$

From a comparison of these two reactions, it is apparent that the caustic etch evolves gas which is less hazardous and produces a resulting liquid which is less dangerous in skin contact accidents. More particularly, the caustic etching process produces hydrogen gas, which is non-poisonous and lighter than air so that it can be vented up an exhaust hood in a convenient and simple fashion. In contrast, the acid etching process produces nitrous oxide, which is poisonous and heavier than air and thus requires expensive and careful handling procedures. From a liquid standpoint, whenever a leak or spill occurs, the caustic etch does not produce the dangerous gases while the acid etch produces the dangerous gases HNO3 and HF by evaporation. Further, the caustic etch process eliminates unnecessary hydrogen fluoride from fabrication plant effluent, as well as the need to scrub NOX from the etch exhaust gases.

While the above provides a full and complete disclosure of the preferred embodiments of the invention, various modifications, alternate constructions and equivalents will occur to those skilled in the art. Therefore, the above should not be construed as limiting the invention, which is defined by the appended claims.

What is claimed is:

1. A method for removing SiOx impurities from a thin silicon crystal web, said method comprising the steps of:

providing a thin web crystal having {111} surface orientation; and applying a caustic solution at a temperature within a preferred range to a surface of the web crystal for a first period of time sufficient for the caustic solution to remove a substantial portion of SiOx impurities present in the web crystal, wherein said value of x ranges from 1 to 2 and SiOx includes nonstoichiometric silicon oxides.

2. The method of claim 1 wherein said step (a) of providing includes the step of growing a thin web using a dendritic web silicon growth process.

3. The method of claim 1 wherein said step (b) of applying includes immersing the thin web crystal in a volume of the caustic solution.

4. The method of claim 1 wherein the caustic solution comprises potassium hydroxide (KOH).

5. The method of claim 1 wherein the caustic solution comprises sodium hydroxide (NaOH).

6. The method of claim 1 wherein the preferred temperature range is from about 80 to about 85° C.

7. The method of claim 1 wherein the first period of time is in the range from about 5 to about 10 minutes.

8. The method of claim 1 further including the step of rinsing the web in deionized water.

9. The method of claim 1 further including the step (c) of applying an acid solution to the web for a second period of time sufficient to remove surface contaminants from the web.

10. The method of claim 9 wherein said acid solution is hydrofluoric acid (HF).

11. The method of claim 10 wherein the acid solution has a concentration of about ten percent HF.

12. The method of claim 9 wherein the acid solution is hydrochloric acid (HCl).

13. The method of claim 12 wherein the acid solution has a concentration of about ten percent HCl.

14. The method of claim 9 wherein the second period of time is in the range from about 1 to about 2 minutes.

15. A method of removing SiOx from a web crystal, comprising the steps of:

providing a web crystal having a surface with SiOx impurities; and applying a caustic solution to the surface for a time period sufficient to remove a substantial portion of the SiOx impurities, wherein said value of x ranges from 1 to 2 an SiOx includes nonstoichiometric silicon oxides.

16. The method of claim 15 wherein the surface has a {111} orientation.

17. The method of claim 15 wherein the caustic solution includes potassium hydroxide.

18. The method of claim 15 wherein the caustic solution includes sodium hydroxide.

19. The method of claim 15 further comprising the step of heating the caustic solution to a temperature from 80 to about 85 degrees Celsius.

20. The method of claim 15 wherein the time period is from five to about ten minutes.

\* \* \* \* \*